(12) United States Patent
Kim et al.

(10) Patent No.: US 7,548,447 B2
(45) Date of Patent: Jun. 16, 2009

(54) SEMICONDUCTOR MEMORY DEVICE AND METHODS THEREOF

(75) Inventors: Jin-Young Kim, Seoul (KR); Ki-Whan Song, Seoul (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 95 days.

(21) Appl. No.: 11/604,823

(22) Filed: Nov. 28, 2006

(65) Prior Publication Data
US 2007/0138524 A1  Jun. 21, 2007

(30) Foreign Application Priority Data
Dec. 19, 2005  (KR)  ............. 10-2005-0125593

(51) Int. Cl.
*G11C 11/24*  (2006.01)
*G11C 11/34*  (2006.01)
*H01L 27/108*  (2006.01)

(52) U.S. Cl. ............. 365/150; 365/149; 365/185.01; 257/296; 257/302

(58) Field of Classification Search ............. 365/150
See application file for complete search history.

(56) References Cited

U.S. PATENT DOCUMENTS

| | | | | |
|---|---|---|---|---|
| 6,077,745 | A * | 6/2000 | Burns et al. ............. | 438/270 |
| 6,440,801 | B1 * | 8/2002 | Furukawa et al. ......... | 438/272 |
| 6,566,682 | B2 * | 5/2003 | Forbes ..................... | 257/51 |
| 6,680,501 | B2 | 1/2004 | Ito | |
| 7,224,024 | B2 * | 5/2007 | Forbes ..................... | 257/329 |
| 2002/0034855 | A1 | 3/2002 | Horiguchi | |
| 2004/0041236 | A1 * | 3/2004 | Forbes ..................... | 257/577 |
| 2005/0064659 | A1 | 3/2005 | Willer | |

FOREIGN PATENT DOCUMENTS

| | | |
|---|---|---|
| KR | 10-0463365 | 12/2004 |
| WO | WO 01/88984 | 11/2001 |

* cited by examiner

*Primary Examiner*—Son L Mai
(74) *Attorney, Agent, or Firm*—Harness, Dickey & Pierce, PLC

(57) ABSTRACT

A semiconductor memory device and methods thereof. The example semiconductor memory device may include a semiconductor substrate, a first source line and a second source line oriented in a first direction, the first and second source lines not in contact with each other, at least one bit line oriented in the first direction and at least one drain positioned between the first and second source lines and the at least one bit line. A first example method may include applying a first voltage to a source line, connected to the memory cell, during a write operation of the memory cell and applying a second voltage to the source line during a read operation of the memory cell, the first and second voltages not being the same and the second voltage not being a ground voltage. A second example method may include applying a first positive voltage to a word line, applying a second positive voltage to a source line, detecting a voltage at a bit line, the detected bit line voltage based on the applied first and second positive voltages and determining whether the memory cell stores data at a first logic level or a second logic level based on the detected bit line voltage.

3 Claims, 9 Drawing Sheets

SEMICONDUCTOR MEMORY DEVICE AND METHODS THEREOF

PRIORITY STATEMENT

This application claims the benefit of Korean Patent Application No. 2005-125593, filed Dec. 19, 2005, the disclosure of which is hereby incorporated herein by reference in its entirety.

BACKGROUND OF THE INVENTION

1. Field of the Invention

Example embodiments of the present invention relate generally to a semiconductor memory device and methods thereof, and more particularly to dynamic random access memory (DRAM) devices and methods thereof.

2. Description of the Related Art

A typical dynamic memory cell may include one access transistor and one data storage capacitor. A first logic level (e.g., a higher logic level or logic "1") may be stored if a sufficient or threshold charge is charged in the data storage capacitor, and a second logic level (e.g., a lower logic level or logic "0") may be stored if there is not a sufficient charge in the data storage capacitor. However, over time, a charged capacitor may gradually lose its charge, such that a periodic refresh may be perform to maintain the capacitor in a "charged" state. If a memory cell array of a conventional semiconductor memory device includes dynamic memory cells with data storage capacitors, it may be difficult to reduce a layout size of the semiconductor memory device.

Accordingly, conventional semiconductor memory devices may include transistors having a floating body. Such a transistor may store a majority carrier and may need be refreshed periodically because the stored majority carrier may disappear after a given period of time. A memory cell including the "floating body" transistor may not include a capacitor (e.g., a data storage capacitor), but rather may operate as a "dynamic memory" cell because the floating body transistor may operate similar to a data storage capacitor. A layout size of semiconductor memory devices including floating body transistors may be relatively cell because, typically, a single floating body transistor is deployed within each dynamic memory cell.

Conventional semiconductor memory devices including dynamic memory cells, each including a single floating body transistor, may commonly apply a ground voltage to sources of a plurality of memory cells in the memory cell array. The sources of the memory cells may common, or shared, and as such may be arranged to cover an entire surface of a substrate of the semiconductor memory device. Conventional semiconductor memory devices may commonly apply the ground voltage to the sources of the memory cells of the memory cell array and may adjust a voltage applied to the bit line and/or the word line to perform a write or read operation.

FIG. 1 is a plane view illustrating a layout of a conventional dynamic random access memory (DRAM) cell array. FIGS. 2 and 3 are cross-sectional views taken along lines A-A' and B-B' respectively, of FIG. 1. The layout of the conventional DRAM cell array is described below with reference to FIGS. 1 to 3.

Referring to FIGS. 1 through 3, a pillar-type silicon layer 2 may be formed at a location of each memory cell MC, and each memory cell MC may include a vertical MOS transistor formed with the pillar-type silicon layer 2. The transistor of each memory cell MC may be formed such that a gate insulating layer 3 may surround the pillar-type silicon layer 2, and an n+-type source diffusion layer 6 may be formed below the pillar-type silicon layer 2. The source diffusion layer 6 may be formed above an entirety of the surface of a substrate 1 to electrically insulate a p-type region of the pillar-type silicon layer 2 from a p-type region of the substrate 1. Thus, in each memory cell MC, the pillar-type silicon layer 2 may be maintained in a "floating" state. The source diffusion layer 6 may be formed to cover the entirety of the surface of the substrate 1 and may bind the memory cells MC to a fixed potential line SS. A surface, which may form the transistor, may be converted by an interlayer insulator 7, and bit lines 8 may be formed on the interlayer insulator 7. The bit lines 8 may extend in a perpendicular direction to word lines to be connected to drain diffusion layers 5 of the memory cells MC. Thus, in summary, the source diffusion layer 6 may be formed so as to cover an entirety of the surface of the substrate 1, and the fixed potential lines SS may be commonly connected to the source diffusion layer 6.

FIG. 4 illustrates an equivalent circuit of the conventional DRAM of FIG. 1. Referring to FIG. 4, four memory cells MC having a floating body may be arranged between the word lines WLi and WLi+1 and the bit lines BLi and BLi+1. Drains of the memory cells MC may be respectively connected to the corresponding bit lines BLi and BLi+1, gates of the memory cells MC may be respectively connected to the corresponding word lines WLi and WLi+1, and sources of the memory cells MC may be connected to a common source line SL. While not shown in FIG. 4, the floating bodies of the memory cells MC may be respectively connected to corresponding drains.

Write and read operations of the conventional memory cells of FIG. 4 will now be described in greater detail.

In conventional write operation of the memory cells MC of FIG. 4, the memory cells MC may use an accumulation of a number of holes, which may be the majority carrier in the floating body of the NMOS transistor which may constitute the memory cell MC. For the write operation, a ground voltage may be applied to the common source line SL, a positive voltage of a first voltage level may be applied to the word line, and a positive voltage of a second voltage level may be applied to the bit line. A relatively large number of electron-hole pairs may be generated around the drain of the NMOS transistor by impact ionization. Of the electron-hole pairs, the electrons may be absorbed to the drain, and the holes may be stored in the floating body, such that the first logic level (e.g., a higher logic level or logic "1") may be written. Alternatively, if a positive voltage of the first voltage level is applied to the word line and a negative voltage of a third voltage level is applied to the bit line, the floating body and the drain may be forward-biased, and a majority of the holes stored in the floating body may be discharged to the drain, such that the second logic level (e.g., a lower logic level or logic "0") may be written. A threshold voltage of the NMOS transistor may be reduced if the first logic level is stored, whereas the threshold voltage of the NMOS transistor may be raised if the second logic level is stored. Thus, the threshold voltage of the NMOS transistor storing the first logic level (e.g., a higher logic level or logic "1") may be lower than the threshold voltage of the NMOS transistor storing the second logic level (e.g., a lower logic level or logic "0"). Accordingly, data may be read based on the threshold voltage of the NMOS transistor during a read operation.

In conventional operation of the memory cells MC of FIG. 4, after the write operation, a negative voltage may be applied to the word line to maintain a state of the threshold voltage of the NMOS transistor storing the first logic level (e.g., a higher logic level or logic "1"). A read operation may thereafter be performed in the data maintaining state.

In conventional read operation of the memory cells MC of FIG. 4, a ground voltage may be applied to the common source line SL, and a voltage between a threshold voltage of the NMOS transistor corresponding to the first logic level and the second logic level may be applied to the word line. An electric current need not flow through the NMOS transistor storing the second logic level, but an electric current may flow through the NMOS transistor storing the first logic level. Thus, if the NMOS transistor stores a threshold voltage corresponding to the second logic level, there may be substantially no electric current change in the bit line connected to the NMOS transistor, and there may be at least some electric current adjustment occurring in the bit line connected to the NMOS transistor if the NMOS transistor is storing the first logic level. Thus, the first and second logic levels may be interpreted based upon a detection of whether or not an electric current fluctuation of the bit line.

As described above, conventional semiconductor memory devices may perform write and read operations by adjusting a level of the voltage applied to the word line and a level of the voltage applied to the bit line, to be set to the positive or negative level, while a ground voltage may be applied to the common source line SL.

SUMMARY OF THE INVENTION

An example embodiment of the present invention is directed to a semiconductor memory device, including a semiconductor substrate, a first source line and a second source line oriented in a first direction, the first and second source lines not in contact with each other, at least one bit line oriented in the first direction and at least one drain positioned between the first and second source lines and the at least one bit line.

Another example embodiment of the present invention is directed to a method of arranging a semiconductor memory device, including arranging first lines on a semiconductor substrate, the first lines oriented in a first direction and each of the first lines not in contact with each other, arranging at least one second line on the semiconductor substrate, the at least one second line oriented in the first direction and arranging at least one drain between the first lines and the at least one second line.

Another example embodiment of the present invention is directed to a method of performing a memory operation of a memory cell, including applying a first voltage to a source line, connected to the memory cell, during a write operation of the memory cell and applying a second voltage to the source line during a read operation of the memory cell, the first and second voltages not being the same and the second voltage not being a ground voltage.

Another example embodiment of the present invention is directed to a method of performing a read operation of a memory cell, including applying a first positive voltage to a word line, applying a second positive voltage to a source line, detecting a voltage at a bit line, the detected bit line voltage based on the applied first and second positive voltages and determining whether the memory cell stores data at a first logic level or a second logic level based on the detected bit line voltage.

Another example embodiment of the present invention is directed to a semiconductor memory device including capacitor-less dynamic memory cells which may control a voltage applied to source lines of the memory cells to perform a write and/or a read operation.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
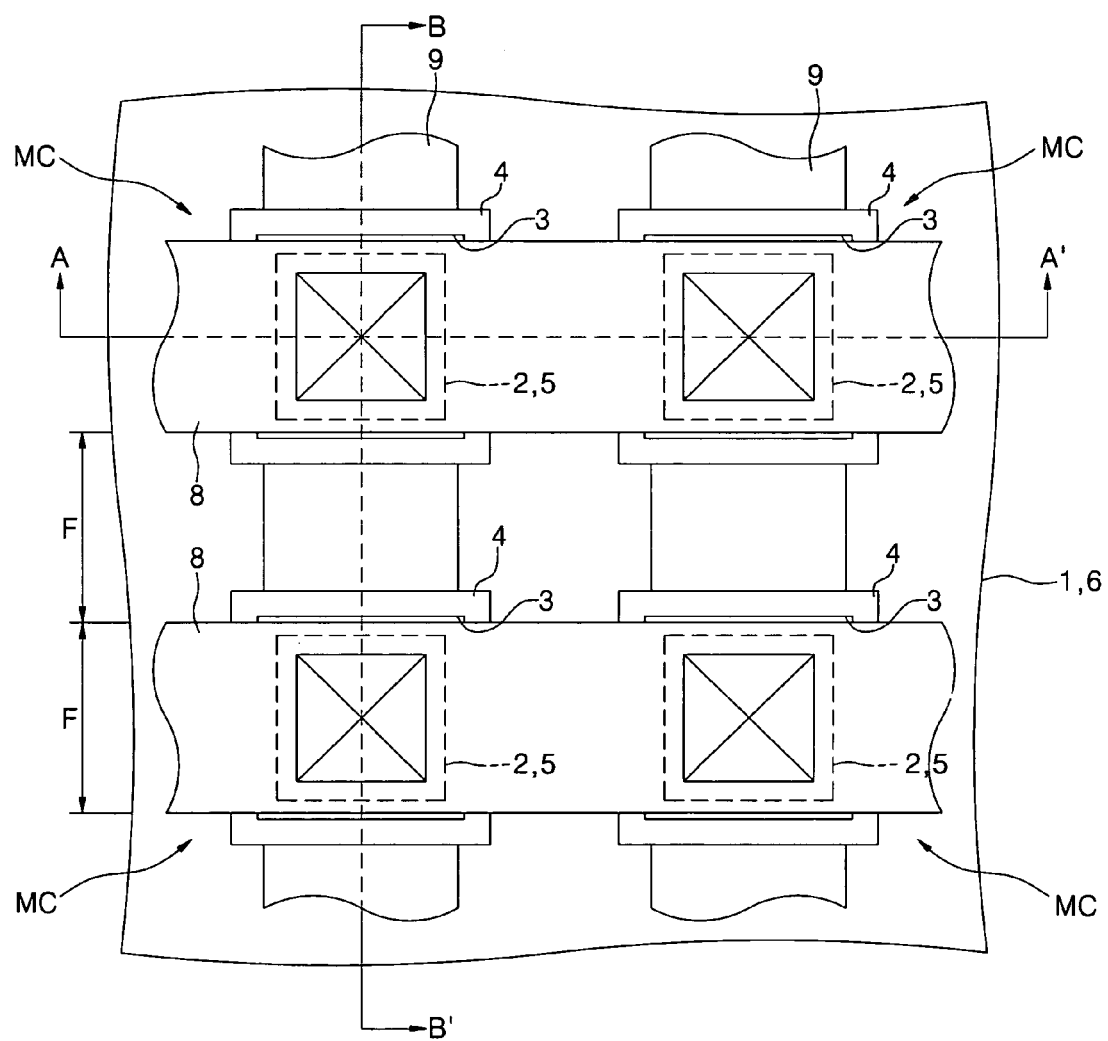
FIG. 1 is a plane view illustrating a layout of a conventional dynamic random access memory (DRAM) cell array.
Figure 2:
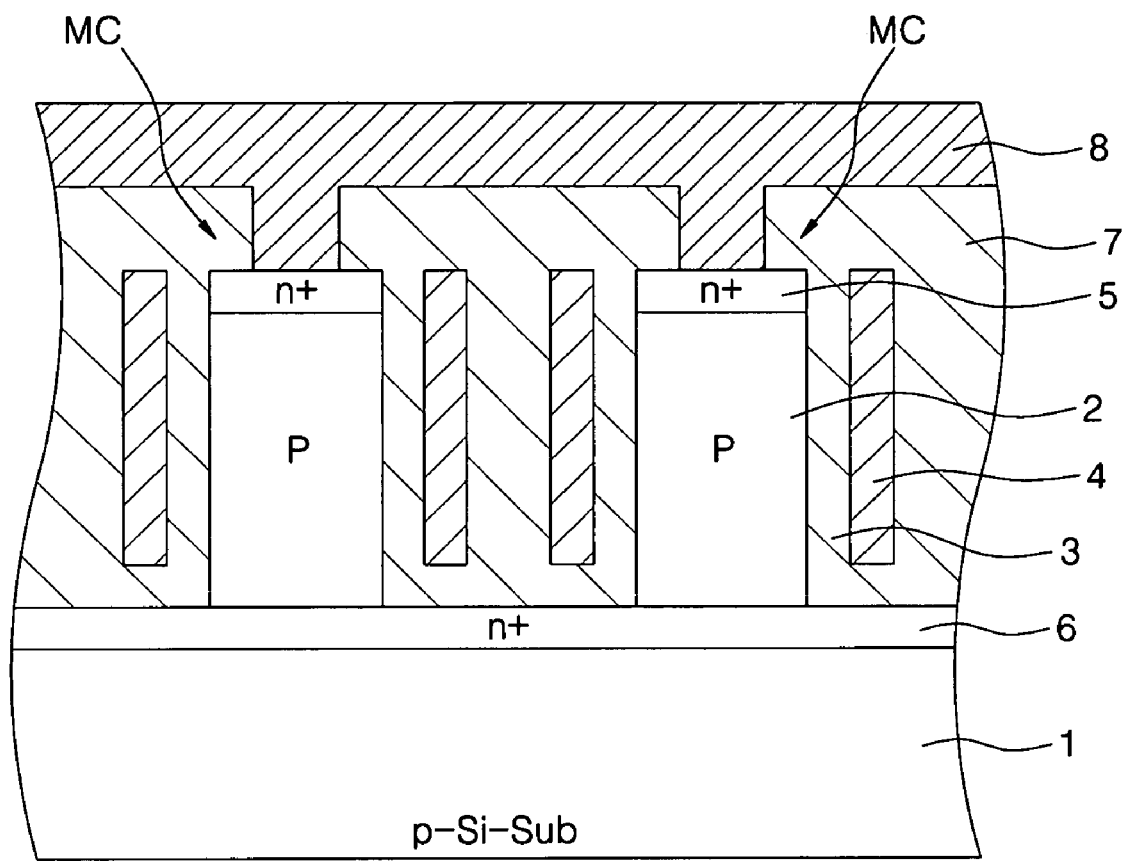
FIGS. 2 and 3 are cross-sectional views taken along lines A-A' and B-B', respectively, of FIG. 1.
Figure 3:
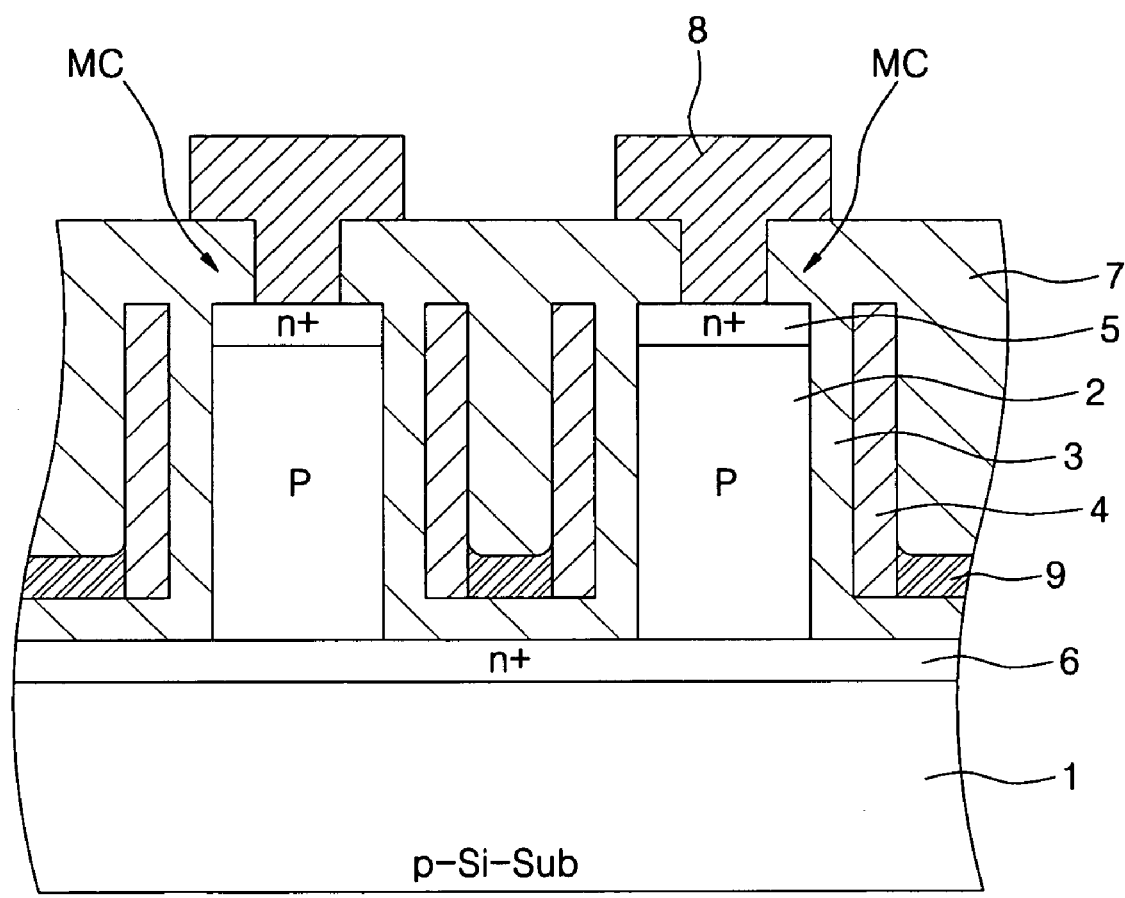

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5:
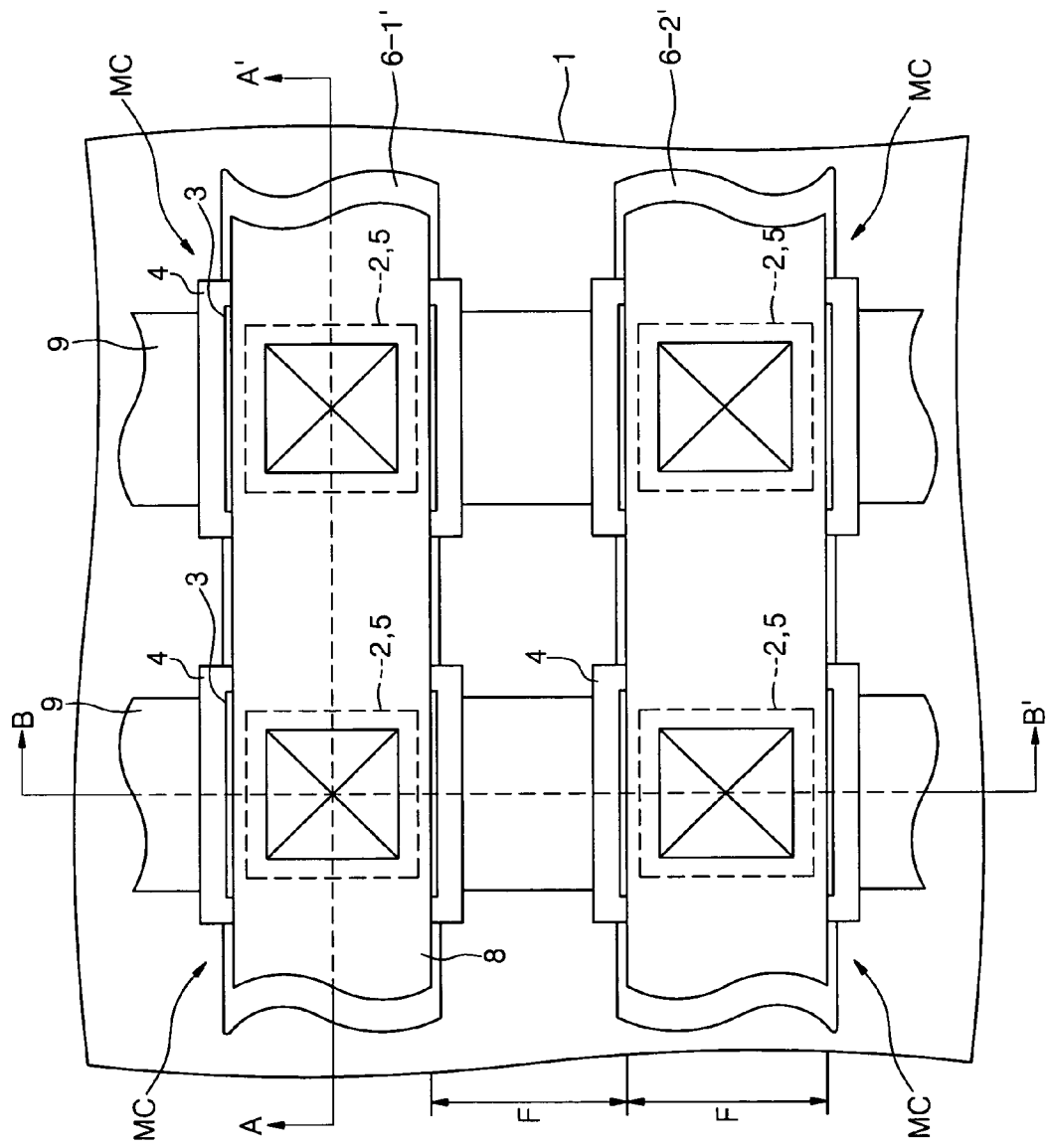
FIG. 5 is a plane view illustrating a layout of a DRAM cell array according to an example embodiment of the present invention.
Figure 6:
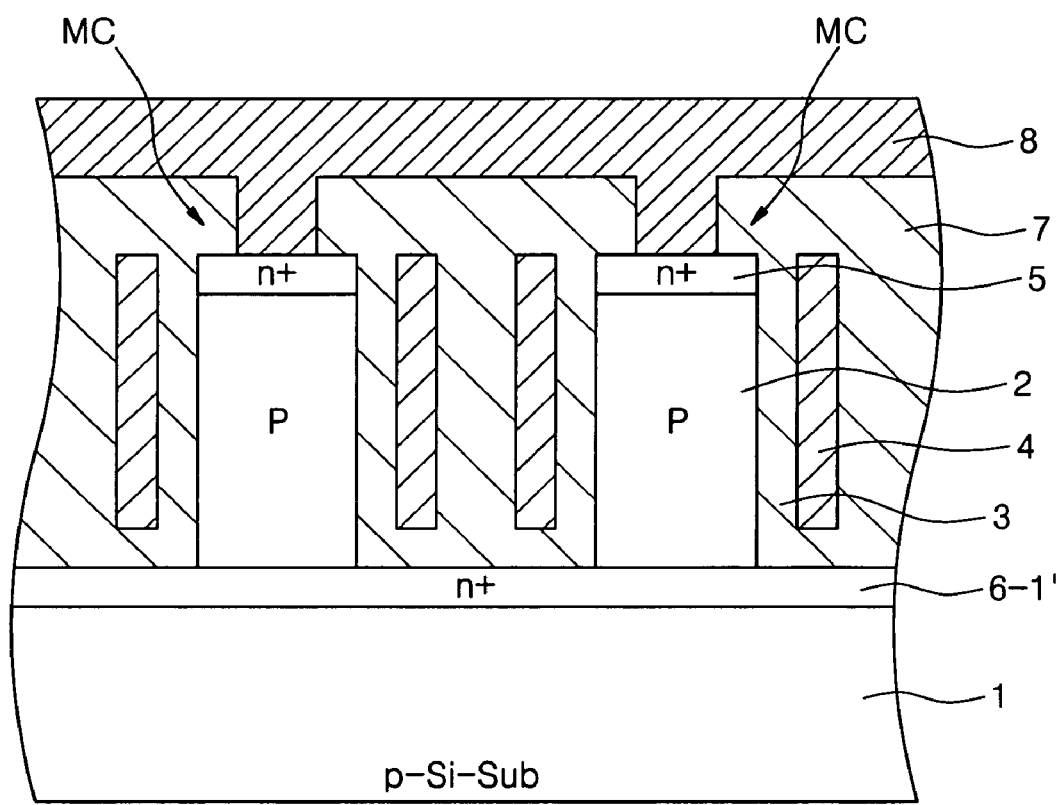
FIGS. 6 and 7 are cross-sectional views respectively taken along lines A-A' and B-B' of FIG. 5.
Figure 7:
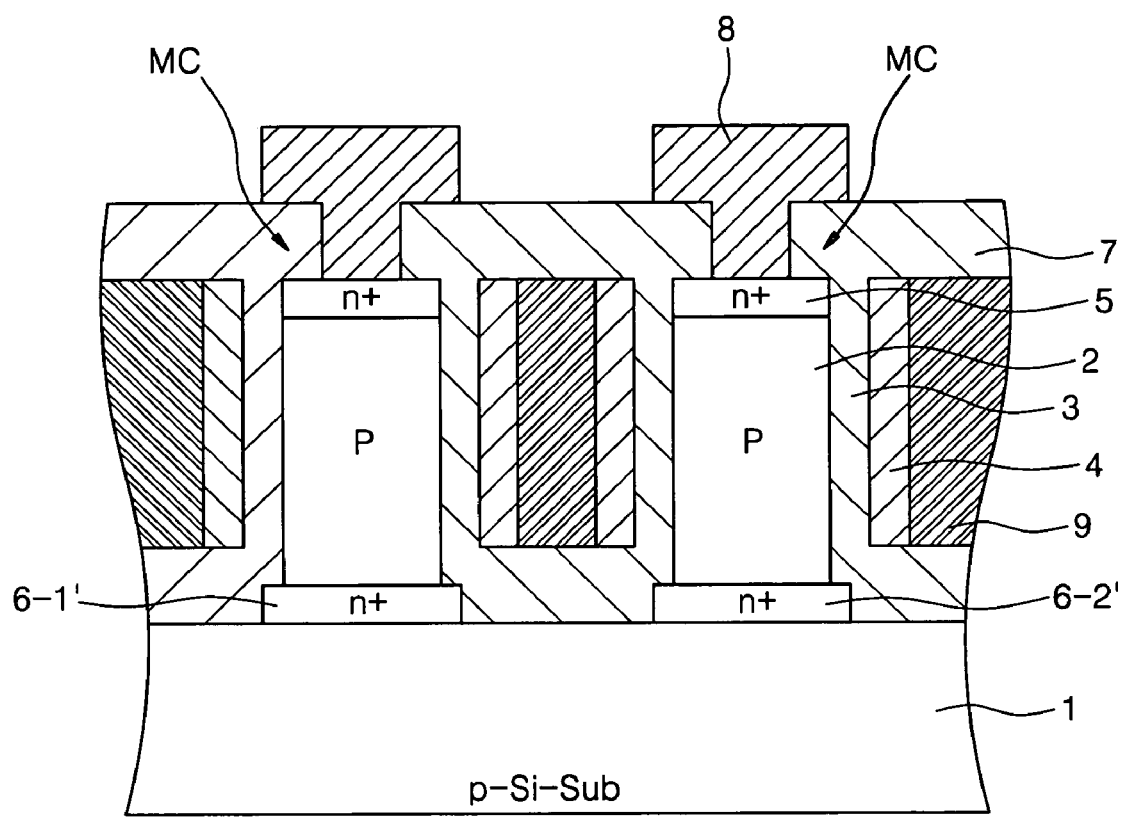

FIG. 5 is a plane view illustrating a layout of a dynamic random access memory (DRAM) cell array according to an example embodiment of the present invention. FIGS. 6 and 7 are cross-sectional views respectively taken along lines A-A' and B-B' of FIG. 5. Generally, as will be described in greater detail below, the layout of the DRAM cell array of the example embodiment of FIG. 5 may be identical to the conventional layout of FIG. 1 except that the source diffusion layer 6 of FIG. 1 may be replaced with source lines 6-1 and 6-2 in the example embodiment of FIG. 5.

Accordingly, in the example embodiment of FIG. 5, the source lines 6-1 and 6-2 may be separately arranged on the p-type silicon substrate 1 to overlap the bit line 8 in the same direction as the bit line 8. A source line may thereby be arranged to overlap the bit line 8 (e.g., a single bit line). In the example embodiment of FIG. 6, the source lines 6-1 and 6-2 may extend in the same direction as the bit line 8 to overlap the bit line 8. In the example embodiment of FIG. 7, the source lines 6-1' and 6-2' may be arranged to overlap the bit line 8 and may further be arranged separately. In an example, the word line 9 may have the same thickness as the gate 4 and may be arranged to connect the gates 4 of the memory cells arranged in a perpendicular direction to the source lines 6-1 and 6-2.

Thus, in the example embodiments of FIGS. 5 through 7, the source lines 6-1 and 6-2 of the DRAM cell array of FIG. 5 may be separately arranged, or partitioned across a surface of the substrate 1, whereas the source diffusion layer 6 of the conventional DRAM cell array of FIG. 1 may be contiguous over an entirety of the surface of the p-type silicon substrate 1. Further, it is understood that the locations of the source lines 6-1' and 6-2' and the bit line 8 are given for example purposes only, and that the source lines 6-1' and/or 6-2' may be arranged in a different manner in other example embodiments of the present invention. For example, the source lines 6-1' and 6-2' may be switched in another example embodiment of the present invention.

Figure 8:
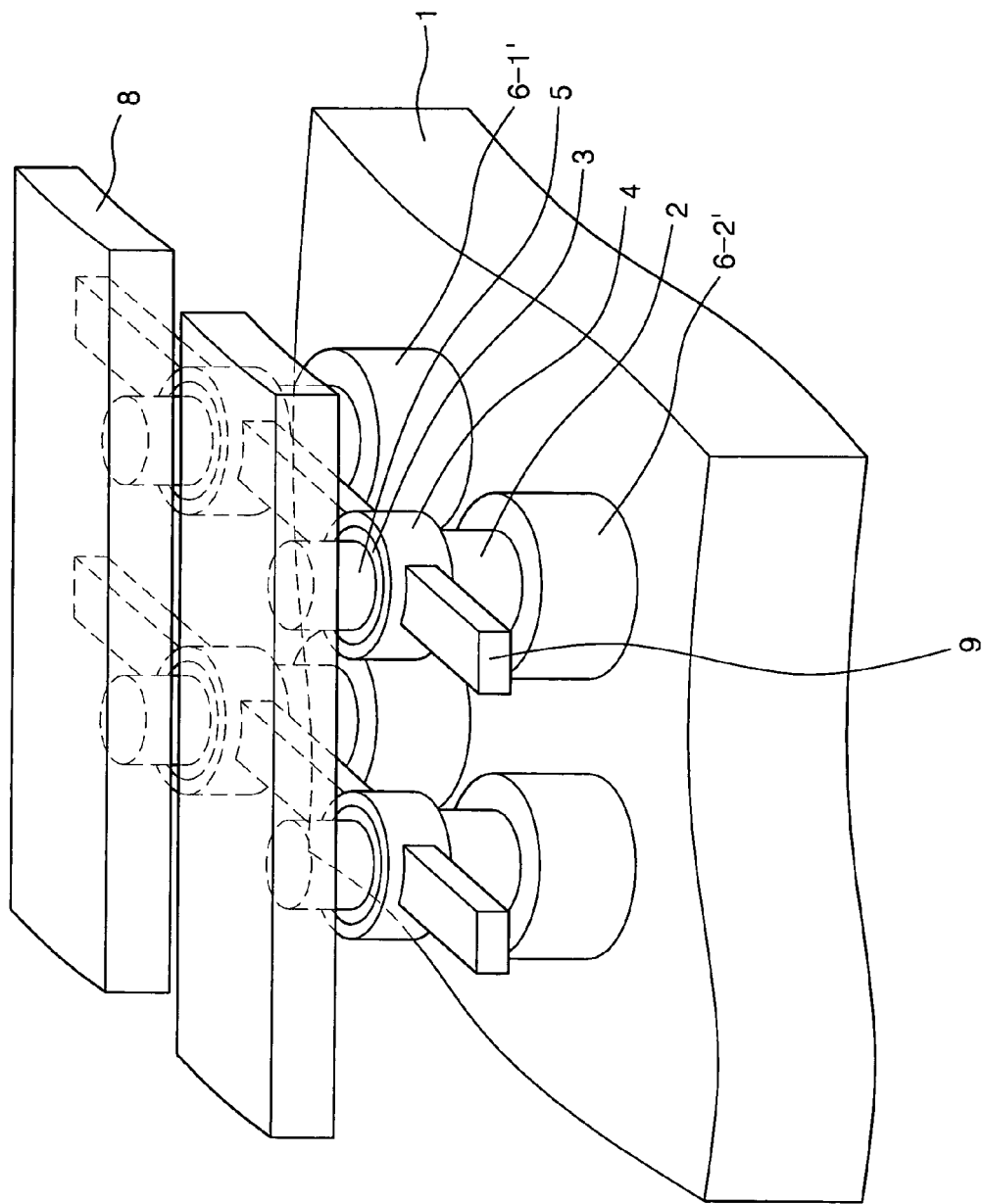
FIG. 8 is a perspective view illustrating the structure of the DRAM cell array of FIG. 5 according to another example embodiment of the present invention.

FIG. 8 is a perspective view illustrating the structure of the DRAM cell array of FIG. 5 according to another example embodiment of the present invention. In FIG. 8, the transistor which may constitute a memory cell may be illustrated as having a "pillar"-type. However, it will be appreciated by one of ordinary skill in the art that other example embodiments may embody the transistor in any number of ways, such as with a "rectangular" type.

In the example embodiment of FIG. 8, the source lines 6-1 and 6-2 may be separately arranged on the substrate 1 in a first direction, and the floating bodies 2 of the memory cells may be respectively arranged on the source lines 6-1 and 6-2. The gates 4 may be separately arranged so as to surround the floating bodies 2 to be insulated, and the word lines 9 may be arranged in a second direction (e.g., perpendicular to the first direction of the source lines 6-1 and 6-2) to connect the gates 4. The drains 5 may be respectively arranged on the floating bodies 3, and the bit lines 8 may be separately arranged in the first direction (e.g., the direction of the source lines 6-1 and 6-2) to overlap the source lines 6-1 and 6-2. Alternatively, in other example embodiments of the present invention, the positioning of the source lines 6-1 and 6-2 may be switched with that of the bit lines 8.

Figure 9:
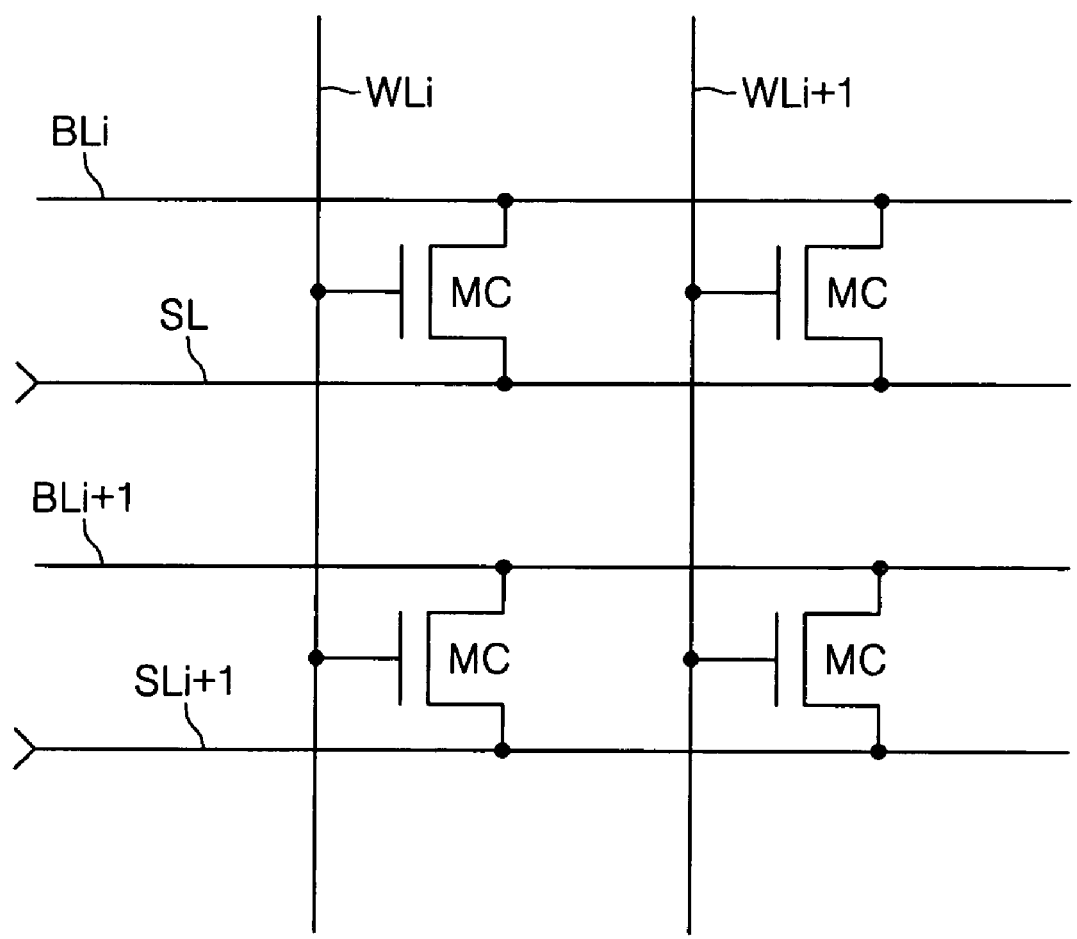
FIG. 9 is an equivalent circuit of the DRAM cell array of FIG. 5 according to another example embodiment of the present invention.

FIG. 9 is an equivalent circuit of the DRAM cell array of FIG. 5 according to another example embodiment of the present invention. In the example embodiment of FIG. 9, each of four memory cells MC may have a floating body arranged among the word lines WLi and WLi+1, the bit lines BLi and BLi+1 and the source lines SLi and SLi+1, respectively. The drains of the memory cells MC may be respectively connected to the corresponding bit lines BLi and BLi+1, the gates of the memory cells MC may be respectively connected to the corresponding word lines WLi and WLi+1, and the sources of the memory cells MC may be connected to the corresponding source lines SLi and SLi+1. While not shown in the example embodiment of FIG. 9, the floating bodies of the memory cells MC may be respectively connected to the corresponding drains.

Example write and read operations of the memory cells MC of the example embodiment of FIG. 9 will now be described in greater detail.

Figure 4:
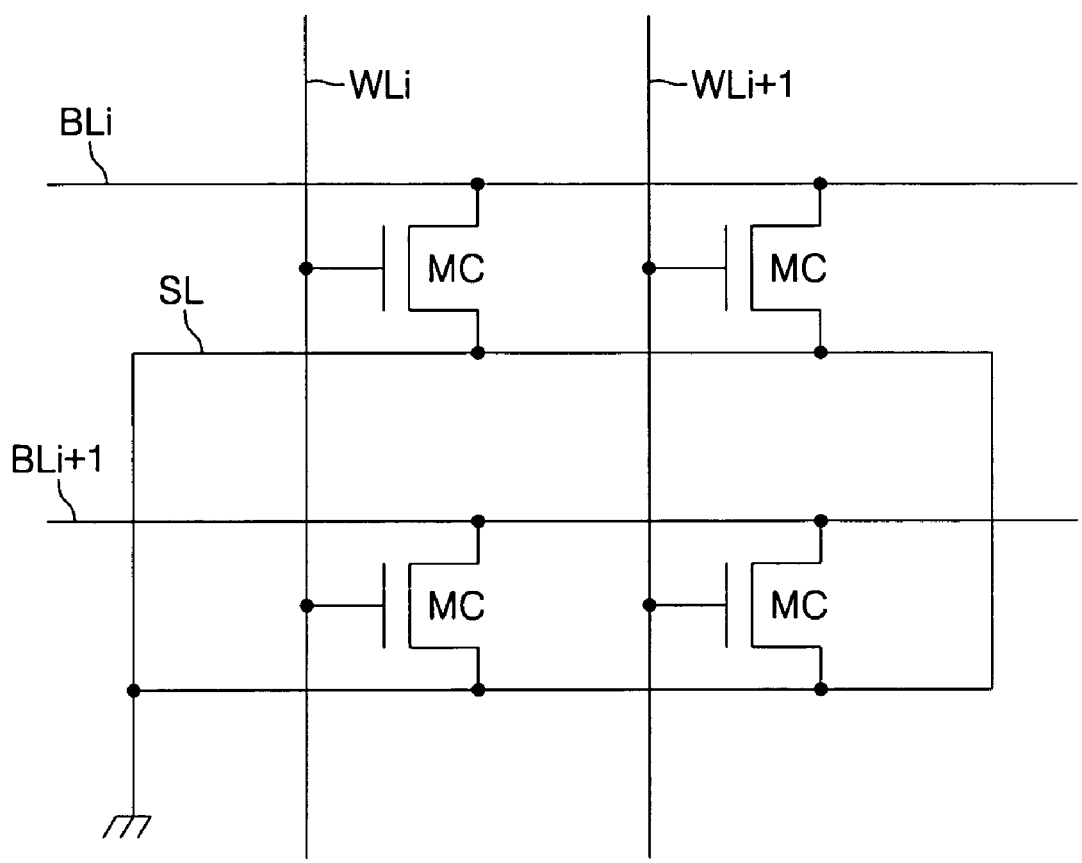
FIG. 4 illustrates an equivalent circuit of the conventional DRAM of FIG. 1.

In an example, a write operation of one of the memory cells MC of FIG. 9 may be performed identically as that of the conventional write operation of the memory cell of FIG. 4. Thus, if a ground voltage is applied to the source line, a positive voltage of the first voltage level (e.g., 0.6 volts) may be applied to the word line, and a positive voltage of a second voltage level (e.g., 1.5 volts) may be applied to the bit line, such that the memory cell may correspond to a first logic level (e.g., a higher logic level or logic "1"). Alternatively, if the ground voltage is applied to the source line, a positive voltage of the first voltage level (e.g., 0.6 volts) may be applied to the word line, and a negative voltage of a third voltage level (e.g., −1.5 volts) may be applied to the bit line, such that the memory cell may correspond to the second logic level (e.g., a lower logic level or logic "0". A threshold voltage (e.g., a stored or retained voltage) of the NMOS transistor may thereby be lower if the memory cell stores the first logic level (e.g., a higher logic level or logic "1"), and the threshold voltage of the NMOS transistor may be higher if the memory cell stores the second logic level (e.g., a lower logic level or logic "0").

In example read operation of one of the memory cells MC of FIG. 9, if a positive voltage of the first voltage level is applied to the word line and a fourth voltage level (e.g., 2 volts, a voltage higher than a ground voltage or 0 Volts, etc.) is applied to the source line of the selected memory cell, a logic level of the NMOS transistor (e.g., a higher logic level or logic "1", a lower logic level or logic "0", etc.) may be read by detecting a voltage of the bit line. Thus, if the first or second logic level is stored in the NMOS transistor, a voltage obtained by subtracting the threshold voltage of the NMOS transistor from a voltage applied to the source line may be generated in the bit line. Thereby, the voltage of the bit line if the NMOS transistor stores the first logic level (e.g., a higher logic level or logic "1") may be greater than the voltage of the bit line if the NMOS transistor stores the second logic level (e.g., a lower logic level or logic "0"). Accordingly, by applying a voltage to the source line, a logic state (e.g., a first or second logic level) of the NMOS transistor may be determined based on a voltage measured at the bit line.

In another example embodiment of the present invention, write and read operations may be performed by controlling a voltage applied to the source line because the source lines may be separately arranged (e.g., as opposed to over an entirety of a substrate).

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory device, comprising:
   a semiconductor substrate;
   first lines oriented in one direction and separately arranged on the semiconductor substrate in another direction;
   floating bodies separately arranged on the first lines at a predetermined interval at locations on which memory cells are arranged;
   gates arranged adjacently to the floating bodies and respectively insulated from the floating bodies;
   word lines separately arranged above the first lines in a perpendicular direction to the first lines and electrically connected to the gates arranged in a perpendicular direction to the first lines;
   drains respectively arranged on the floating bodies; and
   second lines separately arranged on the drains to overlap the first lines and electrically connected to the drains oriented in the same direction as the first lines,
   wherein lines of one group among a group of the first lines and a group of the second lines are bit lines and lines of the other group among the group of the first lines and the group of the second lines are source lines, and a voltage applied to the source lines during a write operation is different from a voltage applied to the source lines during a read operation.

2. The semiconductor memory device of claim 1, wherein the first lines are bit lines and the second lines are source lines.

3. A method of arranging a semiconductor memory device, comprising:
   arranging first lines on a semiconductor substrate the first lines oriented in one direction and oriented separately in another direction;
   arranging floating bodies respectively on the first lines, the floating bodies arranged at a predetermined interval at locations where memory cells are to be arranged and being separated from each other;
   arranging gates to be adjacent to the floating bodies, the gates insulated from the floating bodies;
   arranging word lines above the first lines in a perpendicular direction to the first lines, the word lines separately arranged and electrically connected to the gates arranged in a perpendicular direction to the first lines;
   arranging drains on the floating bodies; and
   arranging second lines on the drains to overlap the first lines, the second lines separately arranged and electrically connected to the drains oriented in the same direction as the first lines,
   wherein lines of one group among a group of the first lines and a group of the second lines are bit lines and lines of the other group among the group of the first lines and the group of the second lines are source lines, and a voltage applied to the source lines during a write operation is different from a voltage applied to the source lines during a read operation.

* * * * *